United States Patent
Hiruta (10) Patent No.: US 9,147,579 B2
(45) Date of Patent: Sep. 29, 2015

(54) METHOD OF MANUFACTURING A SEMICONDUCTOR DEVICE AND A SEMICONDUCTOR DEVICE

(71) Applicant: FUJI ELECTRIC CO., LTD., Kawasaki-shi (JP)

(72) Inventor: Reiko Hiruta, Matsumoto (JP)

(73) Assignee: FUJI ELECTRIC CO., LTD. (JP)

( * ) Notice: Subject to any disclaimer, the term of this patent is extended or adjusted under 35 U.S.C. 154(b) by 0 days.

(21) Appl. No.: 13/944,301

(22) Filed: Jul. 17, 2013

(65) Prior Publication Data
US 2014/0061868 A1    Mar. 6, 2014

(30) Foreign Application Priority Data

Aug. 30, 2012  (JP) .................. 2012-190089

(51) Int. Cl.
*H01L 21/306* (2006.01)
*H01L 29/06* (2006.01)
*H01L 21/3065* (2006.01)
*H01L 21/76* (2006.01)
*G01L 9/00* (2006.01)

(52) U.S. Cl.
CPC ............ *H01L 21/306* (2013.01); *G01L 9/0045* (2013.01); *H01L 21/30655* (2013.01); *H01L 21/76* (2013.01); *H01L 29/0657* (2013.01)

(58) Field of Classification Search
CPC ..... H01L 21/306; H01L 27/12; H01L 21/764; H01L 29/06; H01L 29/84
USPC .................. 257/337, 347, 522, 622, E21.135, 257/E29.256; 438/422, 561
See application file for complete search history.

(56) References Cited

U.S. PATENT DOCUMENTS

| 7,019,364 | B1 | 3/2006 | Sato et al. | |
|---|---|---|---|---|
| 2001/0016398 | A1* | 8/2001 | Kudelka et al. | 438/427 |
| 2006/0057816 | A1 | 3/2006 | Benzel et al. | |
| 2007/0190743 | A1* | 8/2007 | Colombo | 438/424 |
| 2010/0237459 | A1* | 9/2010 | Villa et al. | 257/522 |
| 2011/0049622 | A1* | 3/2011 | Kitahara | 257/337 |
| 2012/0205653 | A1* | 8/2012 | Nishikage et al. | 257/49 |

FOREIGN PATENT DOCUMENTS

| JP | 2001-144276 A | 5/2001 |
|---|---|---|
| JP | 2003-095797 A | 4/2003 |
| JP | 2004-111766 A | 4/2004 |
| JP | 2006-075981 A | 3/2006 |

* cited by examiner

*Primary Examiner* — Karen Kusumakar
*Assistant Examiner* — Adam S Bowen
(74) *Attorney, Agent, or Firm* — Rossi, Kimms & McDowell LLP (57) ABSTRACT

A method of manufacturing a semiconductor device with an SON structure having a thick cavity inside a semiconductor substrate is disclosed. The method forms a plurality of trenches with a predetermined distance between adjacent trenches. Each trench has, at a middle portion between the trench top and bottom, an outwardly expanding sectional shape. High temperature annealing is conducted driving surface migration of silicon atoms in the surface region of the silicon substrate to close the top of the trench, resulting in formation of a plurality of small cavities composed of the trenches in the silicon substrate. Further high temperature annealing joins the plurality of small cavities to form a single cavity. Second opening width x2 at the middle portion ranges from 1.1 times to 1.5 times of first opening width x1 at the top of the trench. Aspect ratio of the trench is at least 8.

12 Claims, 10 Drawing Sheets

| | x2/x1 | CROSS SECTIONAL SHAPE OF THE CAVITY (CAVITIES) | THICKNESS OF CAVITY | PRESSURE IN REACTOR VESSEL | SUBSTRATE TEMPERATURE | OXYGEN GAS FLOW RATE |
|---|---|---|---|---|---|---|
| SAMPLE 1 | 1.0 | THREE SEPARATE CAVITIES | 1.0~1.6 μm | 15mTorr | −10°C | 50sccm |
| SAMPLE 2 | 1.1 | SINGLE CAVITY FORMED | 3.0~5.0 μm | 25mTorr | −5°C | 45sccm |
| SAMPLE 3 | 1.3 | SINGLE CAVITY FORMED | 3.0~5.0 μm | 25mTorr | −5°C | 40sccm |
| SAMPLE 4 | 1.5 | SINGLE CAVITY FORMED | 3.0~5.0 μm | 25mTorr | −5°C | 35sccm |
| SAMPLE 5 | 1.6 | ABNORMAL TRENCH FORMATION | — | 25mTorr | −5°C | 30sccm |

METHOD OF MANUFACTURING A SEMICONDUCTOR DEVICE AND A SEMICONDUCTOR DEVICE

BACKGROUND OF THE INVENTION

A. Field of the Invention

The present invention relates to a method of manufacturing a semiconductor device and a semiconductor device.

B. Description of the Related Art

Semiconductor devices with a silicon on nothing (SON) structure have been disclosed in Japanese Unexamined Patent Applications Publication Nos. 2001-144276, 2003-095797, and 2004-111766, for example. The SON structure includes a cavity (cavities) within a semiconductor substrate of silicon, silicon carbide, gallium nitride, or other semiconductor material. Use of surface migration of silicon atoms has been proposed for manufacturing a semiconductor device with the SON structure. The method conducts surface diffusion of silicon atoms in the surface region of the semiconductor substrate by heat treating the substrate in a hydrogen atmosphere or in a high vacuum environment. The heat treatment eliminates defects on the surface region of the semiconductor substrate on an atomic level and flattens the surface.

Figure 10A:
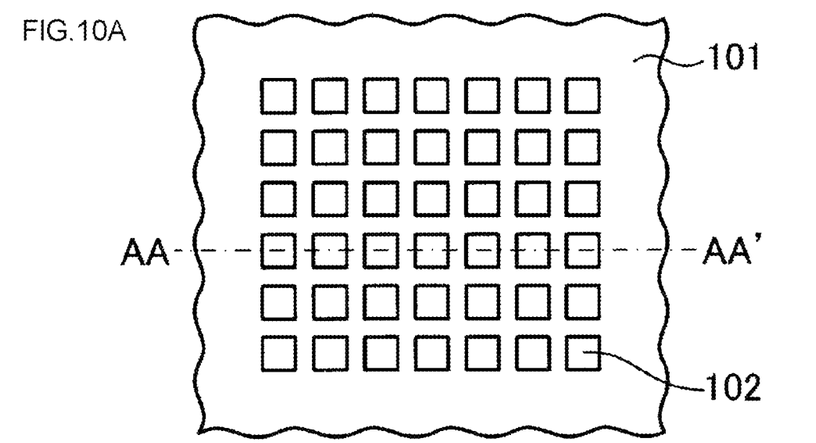
FIGS. 10A, 10B, and 10C illustrate a conventional method of manufacturing a semiconductor device with an SON structure sequentially in the order of manufacturing process.
Figure 10B:
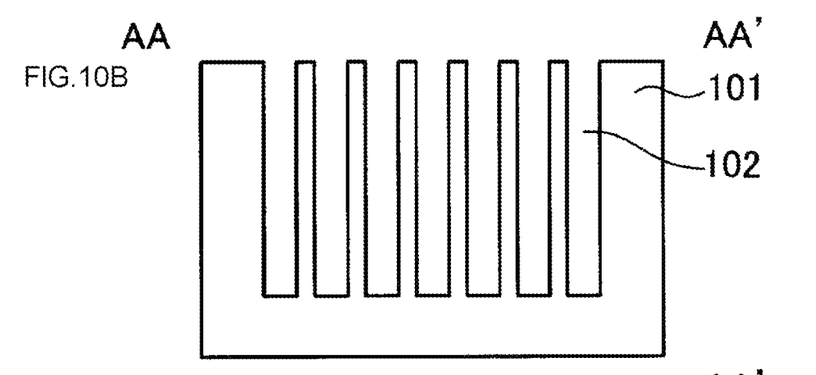
Figure 10C:
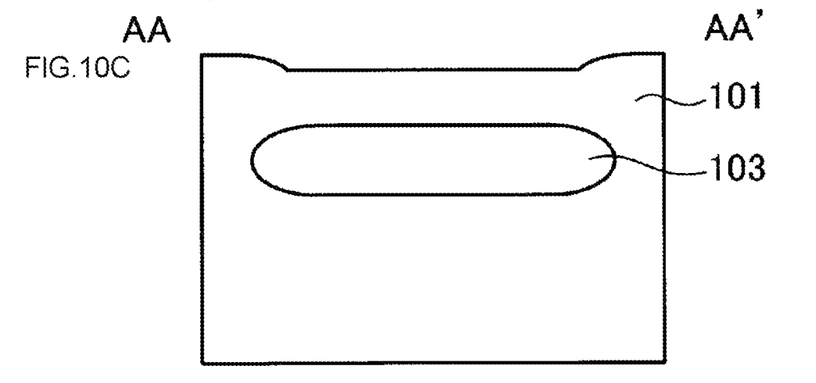

The following describes a method of forming an SON structure by utilizing the surface migration of silicon atoms with reference to FIGS. 10A, 10B, and 10C, which illustrate sequentially a conventional method of manufacturing a semiconductor device with an SON structure in the order of the manufacturing processes. FIG. 10A is a plan view showing a state of the manufacturing processes; FIG. 10B is a sectional view cut along the line AA-AA' in FIG. 10A; and FIG. 10C is a sectional view showing the SON structure formed by a process subsequent to the process shown in FIG. 10A and FIG. 10B.

First, the oxide film formed on the front surface of semiconductor substrate 101 by thermal oxidation is patterned to form a mask oxide film (not shown in the figure) for trench etching process. Then, an anisotropic etching process is conducted using the mask oxide film in the surface region of semiconductor substrate 101 to form a plurality of trenches 102 in a planar layout of a matrix with a depth that does not reach the back surface of semiconductor substrate 101.

After that, a heat treatment process is conducted on the front surface of semiconductor substrate 101 in a hydrogen atmosphere at a temperature of 1,150° C. generating surface migration of silicon atoms in the front surface region of semiconductor substrate 101. Resulting from the surface migration process, the top parts opposite to the bottom parts of trenches 102 are closed to form a plurality of small cavities (not shown in the figure) in semiconductor substrate 101. Further heat treatment joins these plural small cavities into one cavity 103 having a shape of a flat plate with a longitudinal direction parallel to the principal surface of semiconductor substrate 101. Thus, an SON structure is constructed.

Japanese Unexamined Patent Application Publication No. 2001-144276 discloses a method for forming an SON structure utilizing the surface migration of silicon atoms. The method comprises a step of forming a plurality of first trenches in the surface region of a semiconductor substrate, and a step of heat treating the substrate to transform the plurality of first trenches into a single cavity having a shape of a flat plate. The aspect ratio of the first trenches needs to be at least 5. For forming a cavity with a shape of a tube or a form of plate, the first trenches need to be arranged in the shape of a line or a lattice. The distance D between adjacent two first trenches needs to be set below 4R, where R is the radius of the first trench.

Japanese Unexamined Patent Application Publication No. 2006-075981 discloses a device manufactured by another method in which a cavity is formed through at least one access hole during a second period of a trench etching process. At that time, a second trench step is conducted over a set second duration during the second period, and the second duration is set longer than a first duration.

In conventional methods for forming the SON structure described above, however, the thickness of cavity 103 is restricted by the depth of trench 102 and the planar layout of trench 102. Japanese Unexamined Patent Application Publication No. 2001-144276, for example, proposes to arrange the trenches in a planar layout of a stripe shape or a matrix shape with a dimensional conditions of an aspect ratio of at least 5 and a dimensional relationship of D<4R, where D is a distance between adjacent trenches and R is a radius of the trench, in order to transform the trenches into a cavity in a shape of a tube or a plate.

In addition, FIG. 17 of Japanese Unexamined Patent Application Publication No. 2001-144276 shows that the number of cavities transformed from the trenches depends on the depth of the trenches and the distance between the adjacent trenches, and that two cavities are formed from the trenches with an aspect ratio of around 8. Although the SON structure formed by a conventional method forms a relatively thick cavity from trenches of relatively high aspect ratio, the trenches formed with a high aspect ratio result in a plurality of separate cavities. Thus, an SON structure including a thick single cavity can hardly be formed by the conventional methods. Moreover, the conventional methods of forming an SON structure have failed to form a cavity in a flat plate shape with a thickness more than 3 µm. For example, if a diaphragm for pressure detection is manufactured using a semiconductor substrate having a cavity and the cavity does not have a necessary thickness, the diaphragm comes into contact with the bottom of the cavity when the diaphragm is subjected to a pressure and the silicon substrate is deformed, making the pressure measurement impossible.

The present invention is directed to overcoming or at least reducing the effects of one or more of the problems set forth above.

SUMMARY OF THE INVENTION

The present invention has been made to solve the above-described problems. The present invention provides a method of manufacturing a semiconductor device with an SON structure having a thick cavity inside a semiconductor substrate. The invention further provides a semiconductor device with an SON structure having a thick cavity inside a semiconductor substrate.

A method of manufacturing a semiconductor device of the invention is a method of manufacturing a semiconductor device that has a cavity with a shape of a flat plate inside a semiconductor substrate. The method comprises a trench forming step of forming two or more trenches in a surface region of a semiconductor substrate with a predetermined distance between the adjacent trenches, each trench having a sectional shape of outwardly expanding at least at one part in the trench; and an annealing step for closing openings of the trenches and joining all the trenches to form a single cavity inside the semiconductor substrate.

Preferably, the trench forming step forms the trenches each having an outwardly expanding sectional shape at a middle portion between a top part and a bottom part of the trench.

Preferably, the trench forming step forms the trenches each having an outwardly expanding sectional shape with an opening width in the range from 1.1 times to 1.5 times of a width opening at a top part of the trench.

Preferably, the trench forming step forms the trenches each having an aspect ratio of the trench of at least 8.

Since a plurality of trenches are formed in a semiconductor substrate with each trench having a sectional shape outwardly expanding at around the middle portion as compared with portions of other depth of the trench, a process of surface migration of silicon atoms by high temperature annealing can form a single thick cavity having a shape of a flat plate with a thickness thicker than cavities formed by conventional methods inside the semiconductor substrate. Since the trench forming step forms the trenches each having an outwardly expanding sectional shape with an opening width in the range from 1.1 times to 1.5 times of an opening width at a top part of the trench, a single thick cavity can be formed with a shape of planar plate thicker than cavities formed by conventional methods inside a silicon substrate even though the trenches are formed with a high aspect ratio.

A semiconductor device according to the invention is provided with an SON structure having a cavity in a shape of a flat plate inside a semiconductor substrate and a width of the cavity is at least 3 μm.

The present invention has the effect that the method of manufacturing a semiconductor device and the semiconductor device according to the invention provide a semiconductor device with an SON structure having a thick cavity inside a semiconductor substrate. Thus, the invention has the effect that the method of manufacturing a semiconductor device and the semiconductor device according to the invention improve capability of electrical isolation of semiconductor elements.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

The following describes in detail some preferred embodiment of a method of manufacturing a semiconductor device and a semiconductor device with reference to accompanying drawings. In the description and drawings, the same constructions are given the same symbols and repeated description therefor is omitted.

First Embodiment

Figure 1A:
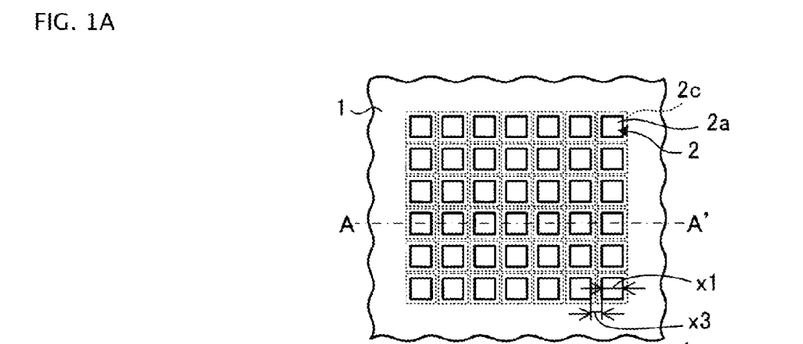
FIGS. 1A, 1B, and 1C illustrate schematically a state of a semiconductor device with an SON structure in a process according to a first embodiment of a method of manufacturing the semiconductor device.
Figure 1B:
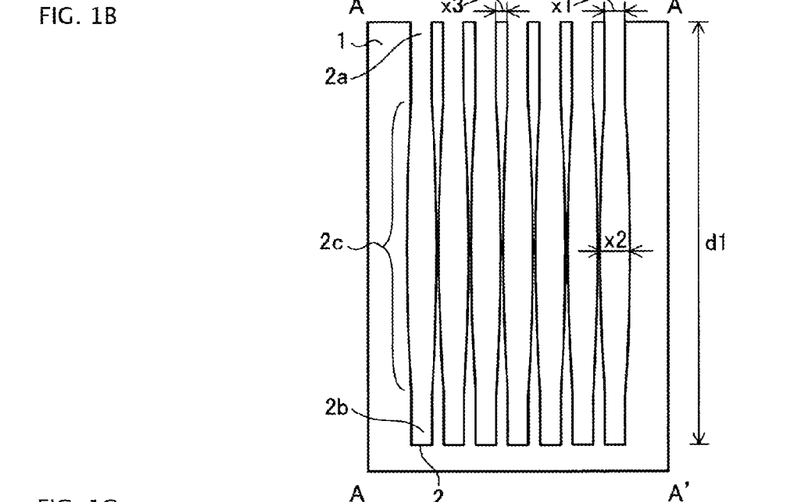
Figure 1C:
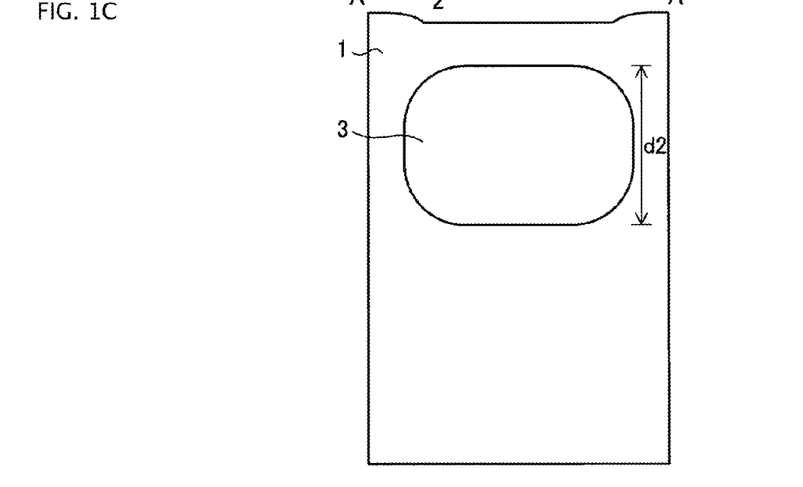

The following describes a method of manufacturing a semiconductor device according to a first embodiment. FIGS. 1A, 1B, and 1C illustrate schematically a state of a semiconductor device with a silicon on nothing (SON) structure in a process according to a first embodiment of a method of manufacturing a semiconductor device. FIGS. 2 through 5 illustrate schematically states of a semiconductor device with a silicon on nothing (SON) structure in a process according to the first embodiment of a method of manufacturing a semiconductor device. FIG. 1A shows a planar layout of trenches 2; FIG. 1B is a sectional view cut along the line A-A' in FIG. 1A; and FIG. 1C is a sectional view showing the SON structure including cavity 3 formed by a process subsequent to the process shown in FIG. 1A and FIG. 1B.

As shown in FIG. 1C, the semiconductor device with an SON structure manufactured by the method of manufacturing a semiconductor device according to the first embodiment includes cavity 3 of a shape of a flat plate inside semiconductor substrate 1 with a longitudinal direction of cavity 3 parallel to the principal surface of semiconductor substrate 1. Cavity 3 is formed by joining trenches 2 formed in the surface region of semiconductor substrate 1 as shown in FIG. 1B through surface migration of silicon atoms.

Figure 2:
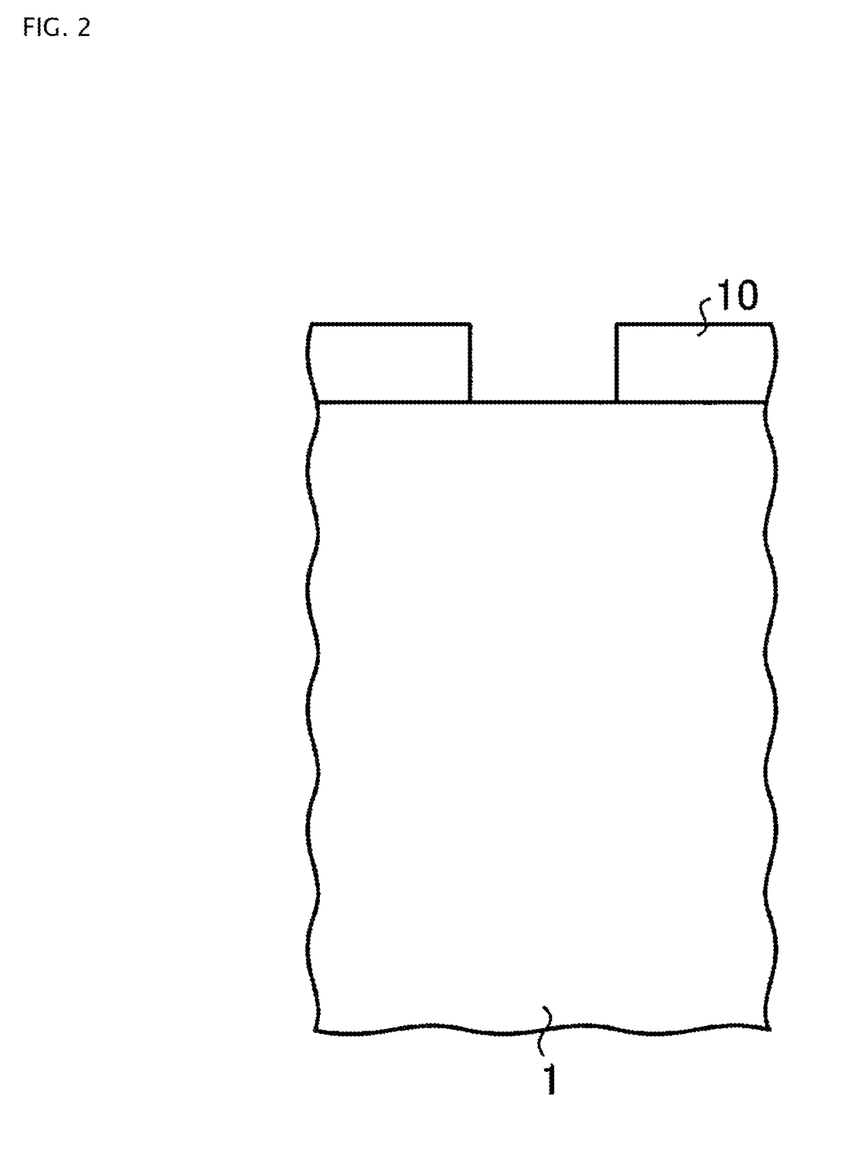
FIG. 2 illustrates schematically a state of a semiconductor device with an SON structure in a process according to a first embodiment of a method of manufacturing the semiconductor device.

More specifically, semiconductor substrate 1 (hereinafter also referred to as silicon substrate 1) is first prepared from a single crystal silicon, for example. Then, mask film 10 is formed on the front surface of silicon substrate 1 as shown in FIG. 2. Mask film 10 is patterned with a pattern of desired planar layout of trenches 2 by means of photolithography. The patterning of mask film 10 can be carried out by means of an anisotropic etching process such as reactive ion etching (RIE).

Mask film 10 is used for an etching mask in an anisotropic etching process for forming trenches 2. Mask film 10 is favorably formed of a material that exhibits a high selectivity ratio with respect to silicon in order to prevent the mask material on the wafer surface from retrogression or depletion. Specific materials for forming mask film 10 can be thermally oxidized film, resist material, and aluminum.

Figure 3:
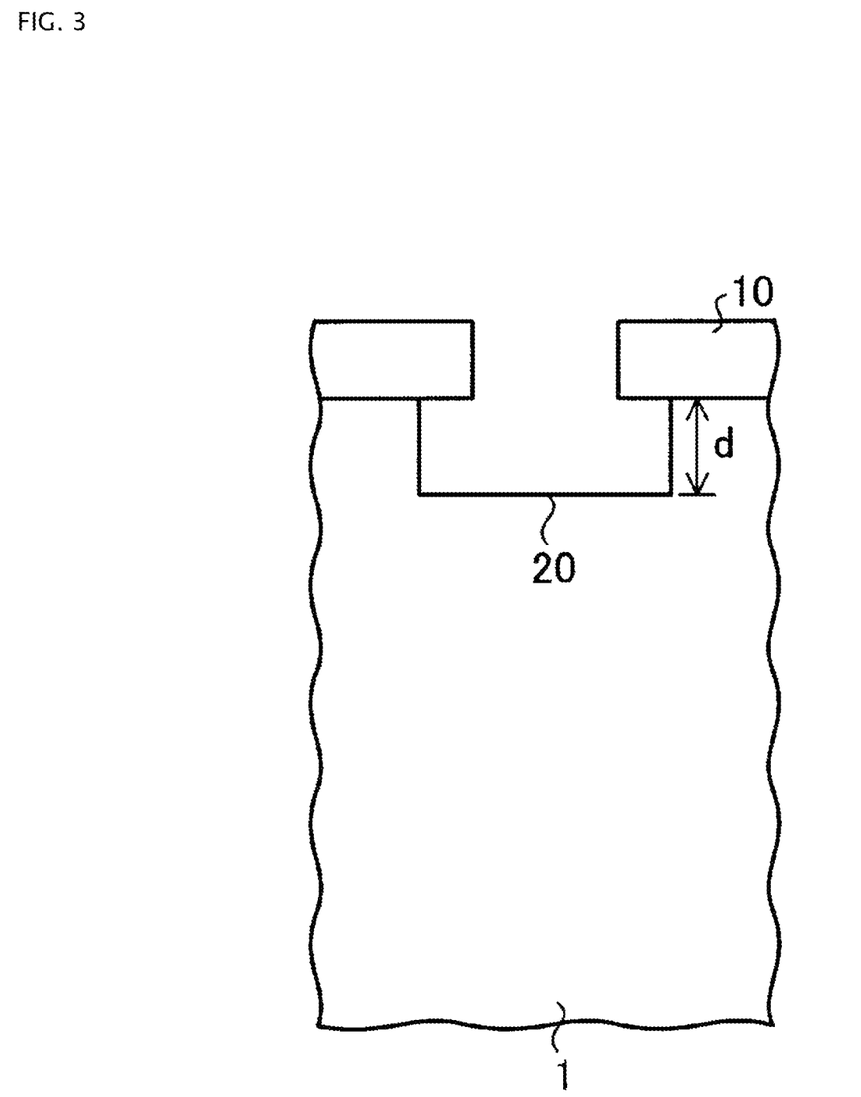
FIG. 3 illustrates schematically a state of a semiconductor device with an SON structure in a process according to a first embodiment of a method of manufacturing the semiconductor device.

Then an anisotropic etching process is conducted using mask film 10 on the front surface of silicon substrate 1 as shown in FIG. 3 to form grooves 20 that are to become trenches 2. Though not expressed in FIG. 3 (also in FIGS. 4 and 5), grooves 20 are formed in multiple number and arranged with a planar layout of a matrix, for example. The anisotropic etching process for forming grooves 20 can be a dry etching process using sulfur hexafluoride ($SF_6$) gas. Then, a side wall protecting film is formed (not shown in the figure) on the side wall of groove 20 using carbon fluoride ($C_4F_8$) gas, for example.

Figure 4:
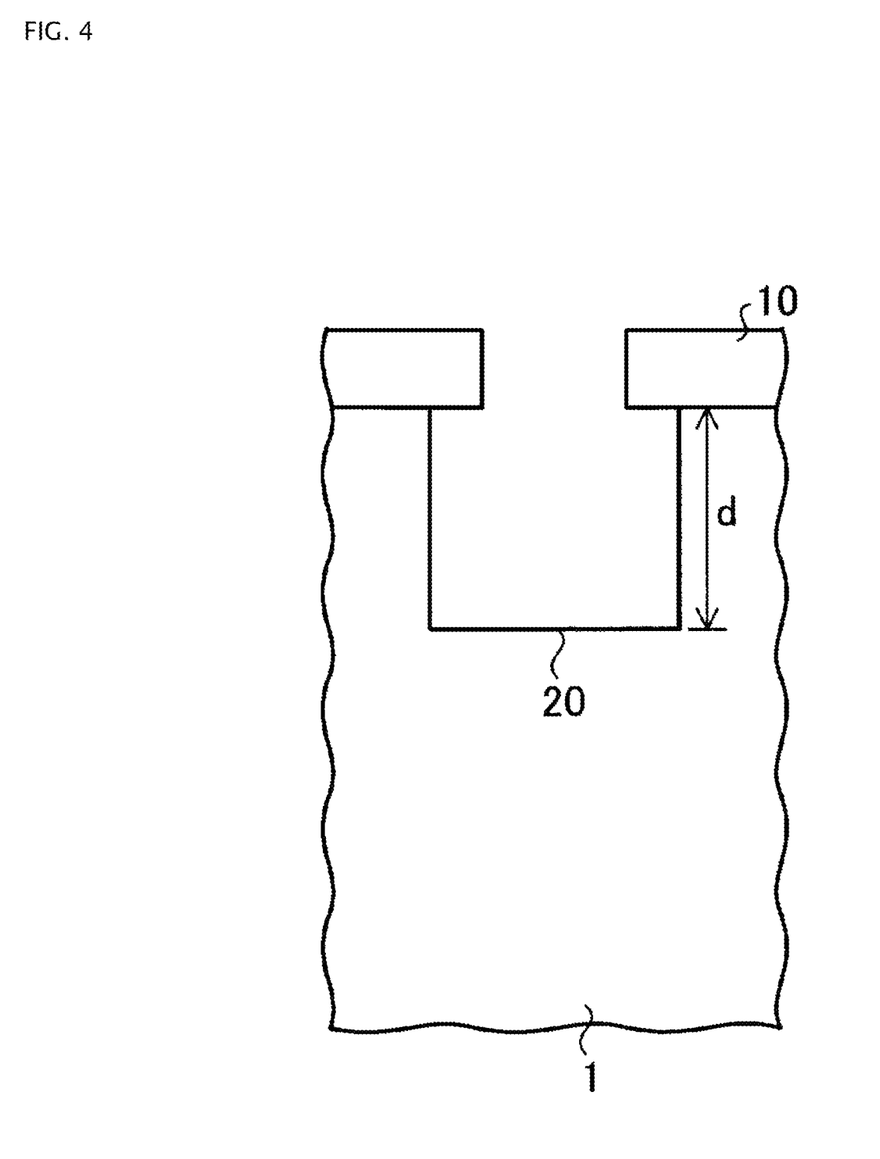
FIG. 4 illustrates schematically a state of a semiconductor device with an SON structure in a process according to a first embodiment of a method of manufacturing the semiconductor device.
Figure 5:
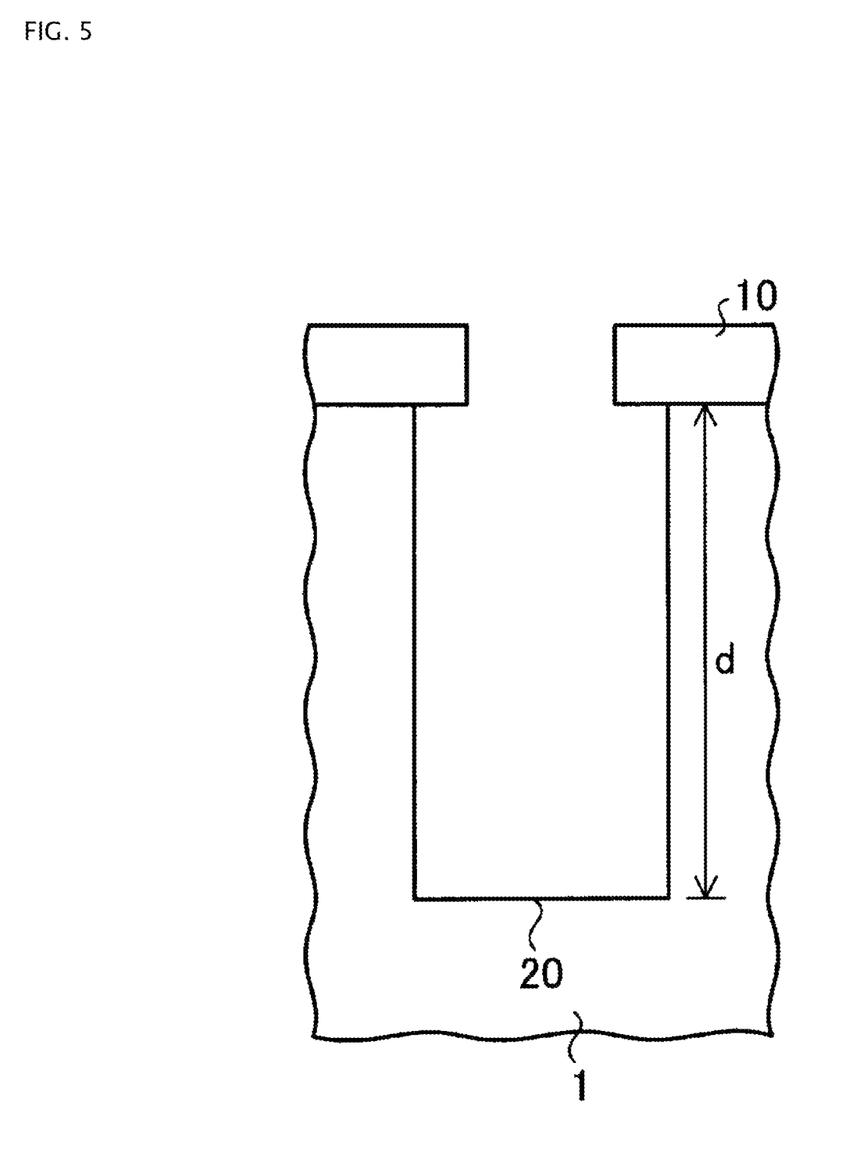
FIG. 5 illustrates schematically a state of a semiconductor device with an SON structure in a process according to a first embodiment of a method of manufacturing the semiconductor device.

The anisotropic etching process and the side wall protecting film forming process are alternately repeated as shown in FIG. 4 and FIG. 5 to make the depth d of groove 20 grow deeper. Thus, a plurality of trenches 2 having a desired high aspect ratio is formed in an arrangement of planar layout of a matrix, for example, as shown in FIGS. 1A and 1B. A planar shape of the opening of a trench can be a square, or other shapes including a hexagon or a circle.

Top part 2a of trench 2, which is the opposite end to bottom part 2b, has a first opening width x1 that can be closed by surface diffusion of silicon atoms in a high temperature annealing process, which will be described afterwards. The first opening width x1 can be 0.4 μm, for example. An opening width is defined as a distance between opposite sides in the cases of the planar shapes of the opening of trench 2 of a polygon such as a rectangle or a hexagon. In the case of the planar shape of the opening of trench 2 of a circle, the opening width is defined as a diameter of the circle. The distance x3 (denoted in FIG. 1A) between two top parts 2a of adjacent trenches 2 can be about 0.2 μm, for example.

Trench 2 is formed in a sectional shape in which a middle portion 2c around the middle position of the final depth d1 of trench 2 is expanding outward as compared with the parts at other depth including top part 2a and the vicinity thereof and bottom part 2b and the vicinity thereof. For example, middle portion 2c is swelled smoothly outward. A second opening width x2, which is a width of the opening at middle portion 2c of trench 2, is preferably in the range of 1.1 times to 1.5 times of the first opening width x1, that is, the ratio x2/x1 is from 1.1 to 1.5.

The trench having the sectional shape with middle portion 2c expanding outward relative to the parts of other depth can be formed by setting a temperature of silicon substrate 1 at a higher value of about −5° C., for example, than the traditional value of −10° C. The raised temperature of substrate 1 increases the etching rate and, further, tends to volatilize the polymer composed of the etching gas, which would slow the progress of etching process down. The higher temperature prevents the volatilized polymer gas from depositing on the side wall.

The process of forming the outwardly expanding trenches allows increased pressure of the gas atmosphere in the reactor vessel and decreased flow rate of oxygen gas or the $C_4F_8$ gas that are introduced into the reactor vessel in order to form the side wall protecting film. Trench 2 may be continued to an adjacent trench at middle portion 2c.

The final depth d1 of trench 2 is preferably a depth that does not reach the back surface of silicon substrate 1, and the aspect ratio d1/x1 is favorably at least 8. Specifically, the final depth d1 can be about 8 μm, for example, in which the aspect ratio is about 20. This dimensional condition of the trench 2 allows single cavity 3 to be formed by high temperature annealing process described later in silicon substrate 1 with a thickness larger than that of cavities formed by conventional technologies.

After removing the mask film for forming trenches 2, a high temperature annealing process at a temperature of 1,150° C. is conducted in a non-oxidizing atmosphere at reduced pressure, which can be a 100% hydrogen atmosphere at a reduced pressure of 10 Torr. The high temperature annealing process drives surface diffusion of silicon atoms in the front surface region of silicon substrate 1. In other words, the high temperature annealing process causes surface migration of silicon atoms in the front surface region of silicon substrate 1. Top part 2a of trench 2 is closed and the front surface of silicon substrate 1 is flattened. Inside silicon substrate 1, a plurality of small cavities (not shown in the figure) is formed from trenches 2.

Continued high temperature annealing process forms single cavity 3 as shown in FIG. 1C joining the plurality of small cavities. Cavity 3 is formed in a shape of a flat plate with a longitudinal direction thereof parallel to the front surface of silicon substrate 1. Cavity 3 has a cross section of a nearly rectangular shape. Cavity 3 formed by a method of the present invention has a thickness larger than that of cavities formed by conventional methods of forming an SON structure, and the thickness d2 of cavity 3 of the embodiment is about 4 μm to 5 μm. After that, an appropriate device structure (not shown in the figure) is formed for a pressure sensor, for example. Thus, a semiconductor device is completed with an SON structure having single cavity 3 with a shape of a flat plate inside silicon substrate 1.

Figure 6:
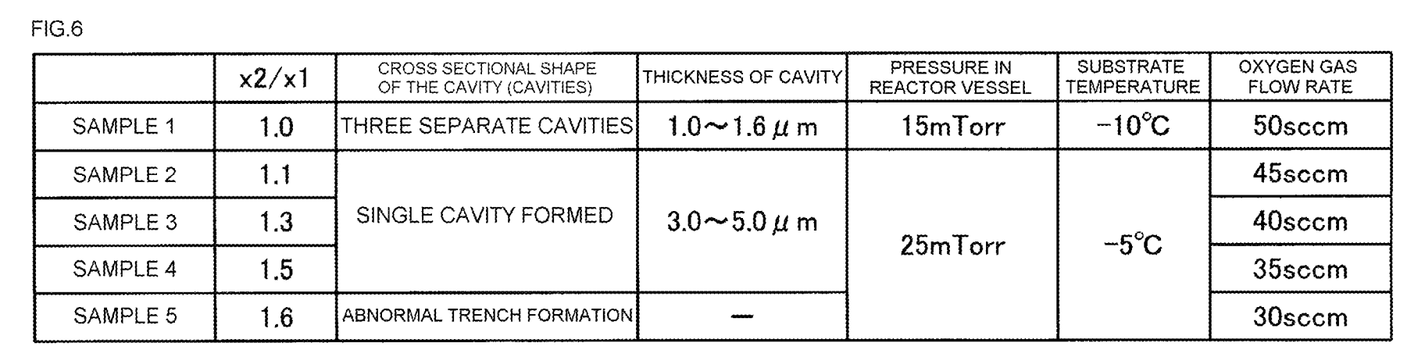
FIG. 6 is a table showing configurations of trenches and resulted cavities of the samples and process parameters in preparing the samples.

The inventor of the present invention studied about the dimensions of trenches 2 and cavity 3. FIG. 6 is a table showing configurations of trenches and resulted cavities of samples and process parameters in preparing the samples. The configurations of trenches includes a ratio of the second opening width x2 in middle portion 2c of trench 2 to the first opening width x1 at top part 2a of trench 2, the ratio x2/x1.

The first sample was manufactured as a comparative example having trenches in a silicon substrate, the trenches having a uniform opening width from the top part to the bottom part and being arranged in a planar shape of a matrix. The ratio x2/x1 is thus, 1.0 for the first sample. The first sample was then subjected to a high temperature annealing process to form a cavity (cavities) inside the silicon substrate. The dimensions of the trenches in the first sample were: a first opening width x1 at the top part of the trench of 0.62 μm and a depth d1 of the trench of 10.2 μm which means an aspect ratio d1/x1 of the trench of 16.5. The distance x3 between the top parts of two adjacent trenches was 0.5 μm.

The process parameters in the process of forming the trenches were: the pressure in the reactor vessel of 15 mTorr and the substrate temperature of −10° C. A flow rate of 50 sccm of oxygen gas was introduced into the reactor vessel during a process for forming a side wall protecting film.

Then, the second through fifth samples were manufactured including trenches 2 with a sectional shape expanding outward at middle portion 2c as compared with the parts at the other depth. The method of manufacturing the second through fifth samples was the same as the method of manufacturing a semiconductor device with an SON structure as described earlier. The ratios x2/x1 of the second through fifth samples were 1.1, 1.3, 1.5, and 1.6, respectively. The second, third, and fourth samples have an appropriate ratio x2/x1 and are embodiments of the present invention. The second through fifth samples were subjected to a high temperature annealing process to form cavity 3 inside silicon substrate 1. The dimensions of the trenches, including the first opening width x1 at the top part of trench 2, the depth d1 of trench 2, and the distance x3 between the trenches at the top part, of the second through fifth samples were equal to those of the first sample.

In the process of forming the trenches in the second through fifth samples, the pressure in the reactor vessel was 25 mTorr, and the temperature of silicon substrate 1 was −5° C. The flow rates of the oxygen gas introduced into the reactor vessel were 45 sccm, 40 sccm, 35 sccm, and 30 sccm for the respective second through fifth samples.

Figure 7:
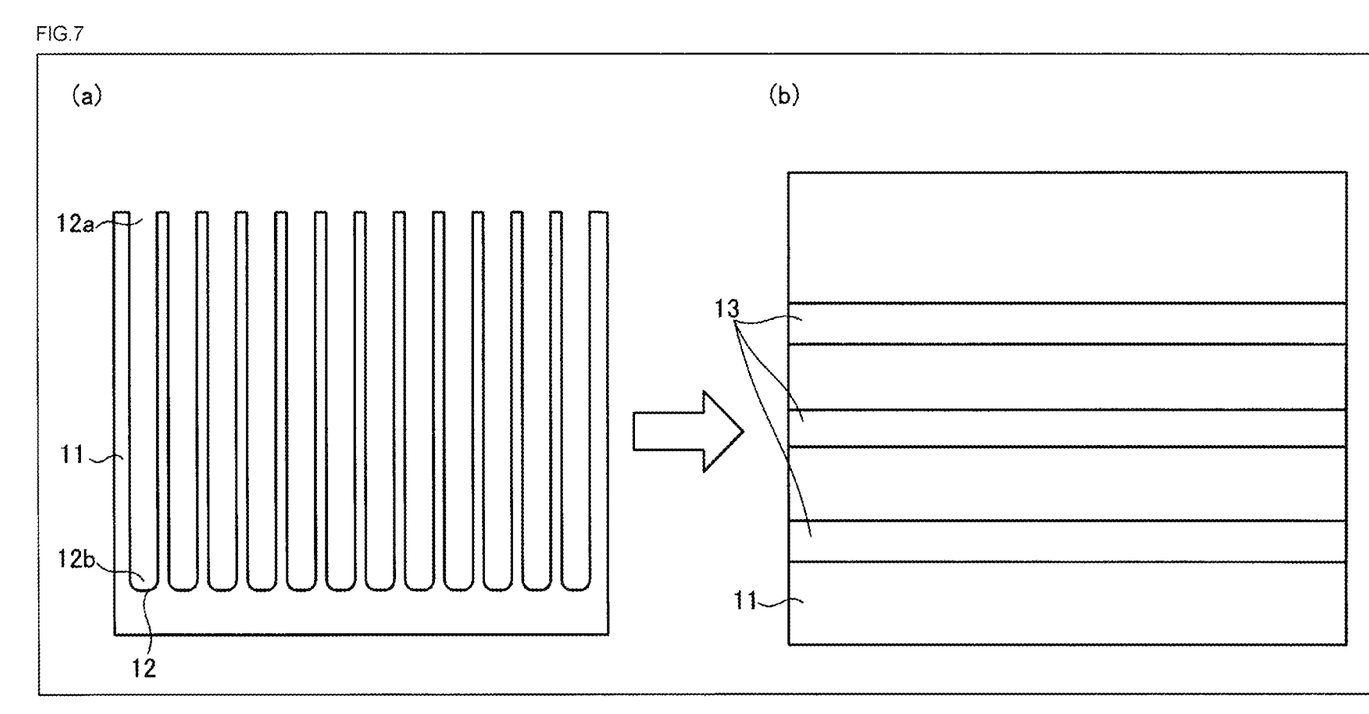
FIG. 7 illustrates schematically a state of a semiconductor device in a process of a comparative example of method of manufacturing a semiconductor device.
Figure 8:
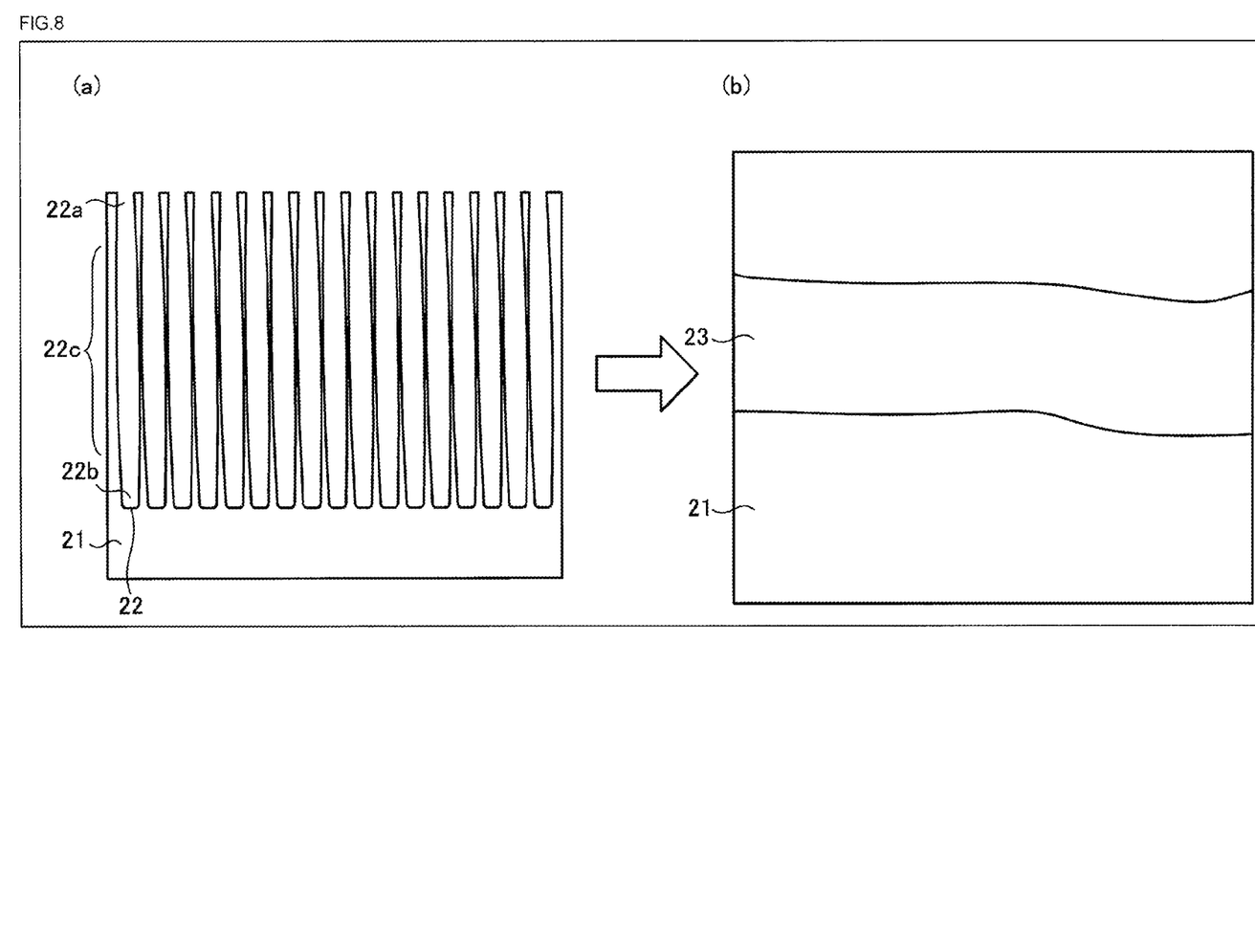
FIG. 8 illustrates schematically a state of a semiconductor device in a process of an embodiment example of method of manufacturing a semiconductor device.

FIG. 7 and FIG. 8 show the states in the process of manufacturing a semiconductor device corresponding to the first and the third samples. FIG. 7 shows schematically the states in the process of manufacturing the first sample, which is a comparative example. The state (a) in FIG. 7 shows schematically trenches 12 having a sectional shape with a uniform opening width from top part 12a to bottom part 12b. The dimensions of trench 12 were an opening width of 0.62 µm and a depth of 10.2 µm, which corresponds to an aspect ratio of 16.5. The state (b) in FIG. 7 is an enlarged view showing cavities 13 formed inside silicon substrate 11 by a high temperature annealing process.

FIG. 8 shows schematically the states in the process of manufacturing the third sample, which is an embodiment of the invention. The state (a) in FIG. 8 shows schematically trenches 22 with a sectional shape expanding outward at around middle portion 22c with respect to the places at the other depth. The dimensions of trench 22 was a first opening width x1 at top part 22a of 0.42 µm and a depth d1 of 7.8 µm, which corresponds to an aspect ratio of 18.5. The state (b) in FIG. 8 is an enlarged view showing cavity 23 formed inside silicon substrate 21 by a high temperature annealing process.

It has been confirmed, as shown in the table of FIG. 6 and the state (b) in FIG. 7, that cavities 13 inside silicon substrate 11 were formed as three separate cavities as in the conventional technology when the ratio x2/x1 is less than 1.1 as in the first sample. The thicknesses of the three cavities were in the range of 1.0 µm to 1.6 µm. When the ratio x2/x1 is larger than 1.5 as in the firth sample, most of the silicon between adjacent trenches disappeared in the etching process for forming trenches 2, failing to form good trenches 2, as indicated as "abnormal trench formation" in the table of FIG. 6.

As shown in the table of FIG. 6, it has been confirmed that when the ratio x2/x1 is in the range of 1.1 to 1.5 as in the second, third, and fourth samples, a single cavity 3 is formed inside silicon substrate 1. As in the third sample shown the state (b) in FIG. 8, a single cavity 23 is formed in a shape of a flat plate with a longitudinal direction parallel to the principal surface of silicon substrate 21 extending over the region where trenches 22 have been formed. The thickness of cavity 23 was in the range of 3.0 µm to 5.0 µm, which is certainly thicker than the thickness of cavities 13 in the first sample. Thus, the ratio x2/x1 is preferably in the range from 1.1 to 1.5 when trenches 2 are formed.

The study described above has shown that the firth sample having the ratio x2/x1 larger than 1.5 failed to achieve the same effect as in the second, third, and fourth samples, which are embodiments of the invention. However, the fifth sample, despite with a ratio x2/x1 larger than 1.5, can basically form trenches 2 having a sectional shape expanding outward at around middle portion 2c as compared with the parts at other depth like the samples of embodiments. Consequently, if the etching conditions in the process of forming the trenches 2 are varied to find the optimum condition, the same effect can be expected in a construction with a ratio x2/x1 larger than 1.5, too.

As described thus far about the first embodiment of the invention, a single cavity with a shape of a flat plate is formed inside a silicon substrate with a thickness larger than conventional ones by surface migration of silicon atoms driven by a high temperature annealing process. The trenches in the first embodiment are formed having a sectional shape expanding outward at around the middle portion as compared with the parts at other depth. A ratio x2/x1 in the range from 1.1 to 1.5 according to the first embodiment can form a single cavity with a shape of a flat plate having a thickness larger than conventional ones inside a silicon substrate, even though the trenches are formed with a high aspect ratio. Therefore, a method according to the first embodiment provides a semiconductor device with an SON structure having a thick cavity inside a silicon substrate.

In application of an SON structure having a cavity formed inside a silicon substrate to a pressure sensor such as a semiconductor strain gauze sensor, for example, a thin cavity as in the conventional ones causes a problem that the diaphragm of the sensor may come into contact with the bottom of the cavity when the silicon substrate is deformed with the pressure exerted on the diaphragm. Thus, pressure detection is impossible with such a thin cavity. According to the first embodiment of the invention, a cavity is formed with a thickness larger than the conventional one, thus the diaphragm is prevented from touching the bottom of the cavity. Therefore, improvement is achieved in detection range and detection sensitivity of a pressure sensor. Because the cavity according to the first embodiment of the invention is thicker than the conventional one, the cavity formed inside a silicon substrate can be used for an isolation region between semiconductor elements in an integrated circuit (IC) with improved ability of electrical isolation between the elements.

Second Embodiment

The following describes a method of manufacturing a semiconductor device with an SON structure according to a second embodiment of the present invention. The method of manufacturing a semiconductor device with an SON structure according to the second embodiment forms trenches by repeating alternately an anisotropic etching process and a side wall protecting film forming process as in the first embodiment. But sectional shapes of trenches in the second embodiment are different from those in the first embodiment, while other specifics are similar. The method of manufacturing a semiconductor device with an SON structure according to the second embodiment forms trenches with a sectional shape including at least one part along the depth direction, at which part an opening width is wider than a first opening width at the top of the trench.

The following describes some examples of the sectional shape of the trenches formed by the method according to the second embodiment of manufacturing a semiconductor device with an SON structure. FIGS. 9A through 9E each illustrate schematically a state of a semiconductor device with an SON structure in a process according to a second embodiment of a method of manufacturing the semiconductor device. FIGS. 9A through 9E show sectional shapes of the trenches that can be arranged in a planar layout of matrix, for example, as in the first embodiment. FIGS. 9A through 9E are sectional views cut along the line A-A' in FIG. 1A. Only two adjacent trenches are shown and other trenches are omitted in each of the FIGS. 9A through 9E. The symbols 30 and 40 in the figures designate silicon substrate.

Figure 9A:
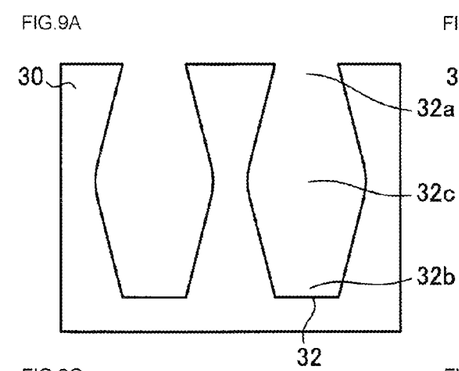
FIGS. 9A through 9E illustrate schematically a state of a semiconductor device with an SON structure in a process according to a second embodiment of a method of manufacturing the semiconductor device.
Figure 9B:
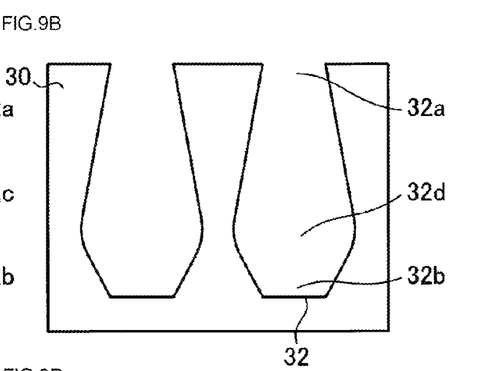
Figure 9C:
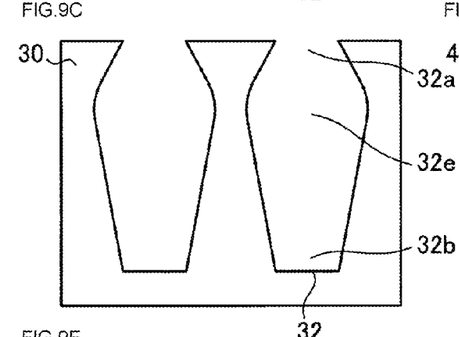

As shown in FIG. 9A, trench 32 can have a sectional shape with the opening width gradually decreasing from middle part 32c towards top part 32a and towards bottom part 32b. The opening width of trench 32 is widest at middle part 32c. The position of the widest opening width in trench 32 is not necessarily middle position 32c but can be position 32d deeper than the middle part of trench 32 as shown in FIG. 9B, the position being referred to as a first depth position, or position 32e shallower than the middle part as shown in FIG. 9C, the position being referred to as a second depth position.

Figure 9D:
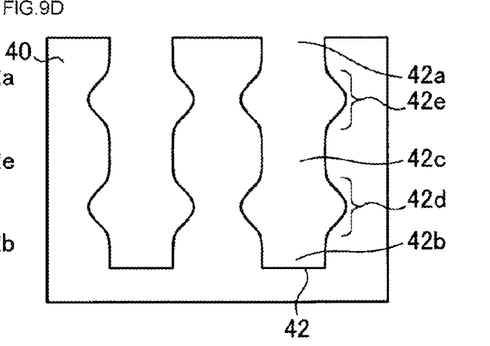
Figure 9E:
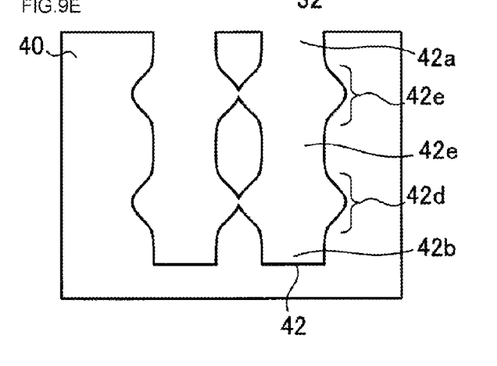

As shown in FIG. 9D, trench 42 can have a sectional shape expanding outward at position 42d near the first depth position as compared with other parts, and expanding outward at position 42e near the second depth position as compared with other parts. Thus, trench 42 can have two or more parts expanding outward. Moreover, as shown in FIG. 9E, adjacent trenches can be connected at position 42d near the first depth position or at position 42e near the second depth position.

For forming trenches 32 and 42 having a sectional shape expanding outward as shown in FIGS. 9A through 9E, the processes for forming side wall protective film on the portion near middle part 32c, first depth part 32d and second depth part 32e of trench 32 and the portion near first depth part 42d and second depth part 42e of trench 42 are conducted under an enhanced pressure of the gaseous atmosphere in the reactor vessel or a reduced gas flow rate introduced into the reactor vessel as in the case of the first embodiment. Further, the time duration for etching can be elongated in the process of etching the portion near middle part 32c, first depth part 32d and second depth part 32e of trench 32 and the portion near first depth part 42d and second depth part 42e of trench 42. Thus, the trenches having such sectional shapes expanding outward as shown in FIGS. 9A through 9E can be formed under varied etching conditions.

In the second embodiment, the opening widths are approximately equal to the second opening width x2 at the middle part of the trench in the first embodiment, at the positions of the second embodiment near middle part 32c, first depth part 32d and second depth part 32e of trench 32 and the portion near first depth part 42d and second depth part 42e of trench 42. The other dimensions are similar to those in the first embodiment.

As described above, the second embodiment has the same effects as the first embodiment.

The present invention can be applied in various forms without deviating from the scope and spirit of the invention. For example, although the trenches are arranged in the planar layout of a matrix in the embodiments described thus far, the trenches can be arranged in a planar layout of a stripe that extends in the direction perpendicular to the row of trenches. While in the embodiments described thus far, the process for generating surface migration of silicon atoms in the front surface side of a silicon substrate was carried out by high temperature annealing in a hydrogen atmosphere at a reduced pressure of 10 Torr and at a temperature of 1,150° C., the annealing temperature can be lower than 1,150° C. and the reduced pressure of the hydrogen atmosphere can be higher than 10 Torr.

Although in the embodiments described thus far, the semiconductor substrate is a silicon substrate, semiconductor substrate of other than silicon can be used for forming a similar cavity.

A method of manufacturing a semiconductor device and a semiconductor device of the present invention can be favorably applied to semiconductor pressure sensing devices, and semiconductor devices having a construction having a cavity inside a semiconductor substrate.

Thus, a semiconductor and method for its manufacture have been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

What is claimed is:

1. A method of manufacturing a semiconductor device that has a cavity with a shape of a flat plate inside a semiconductor substrate, the method comprising:
   a trench forming step of forming two or more trenches in a surface region of a semiconductor substrate with a predetermined distance between the adjacent trenches, each trench having a sectional shape which outwardly expands at least at one part in the trench, such that at least one region in the depth direction of the trench is wider than regions above and below it in the depth direction; and
   an annealing step for closing openings of the trenches and expanding the outwardly expanding part of the trench to join all the trenches to form a single cavity inside the semiconductor substrate,
   wherein a trench interval x3 is smaller than a trench opening width x1.

2. The method according to claim 1, wherein the trench forming step forms the trenches each having an outwardly expanding sectional shape at a middle portion between a top part and a bottom part of the trench.

3. The method according to claim 1, wherein the trench forming step forms the trenches each having an outwardly expanding sectional shape with an opening width in the range from 1.1 times to 1.5 times of an opening width at a top part of the trench.

4. The method according to claim 1, wherein the trench forming step forms the trenches each having an aspect ratio of the trench of at least 8.

5. The method according to claim 2, wherein the trench forming step forms the trenches each having an aspect ratio of the trench of at least 8.

6. The method according to claim 3, wherein the trench forming step forms the trenches each having an aspect ratio of the trench of at least 8.

7. A semiconductor device that has a cavity with a shape of a flat plate inside a semiconductor substrate and with a thickness of the cavity of at least 3 μm.

8. A semiconductor device according to claim 7, wherein the cavity is surrounded by the semiconductor substrate.

9. The method according to claim 1, wherein the trench forming step is performed by dry etching.

10. The method according to claim 1, wherein the cavity is constructed only by the semiconductor substrate.

11. The method according to claim 1, wherein the thickness of the cavity formed by annealing is 3 μm or more.

12. The method according to claim 1, wherein the trench forming step comprises etching to expand adjacent trenches outwardly.

* * * * *